(12) United States Patent
Tago et al.

(10) Patent No.: US 7,297,575 B2
(45) Date of Patent: Nov. 20, 2007

(54) SYSTEM SEMICONDUCTOR DEVICE AND METHOD OF MANUFACTURING THE SAME

(75) Inventors: Masamoto Tago, Tokyo (JP); Akihiro Dohya, Tokyo (JP)

(73) Assignee: NEC Corporation, Tokyo (JP)

( * ) Notice: Subject to any disclaimer, the term of this patent is extended or adjusted under 35 U.S.C. 154(b) by 220 days.

(21) Appl. No.: 11/103,469

(22) Filed: Apr. 12, 2005

(65) Prior Publication Data

US 2005/0179057 A1 Aug. 18, 2005

Related U.S. Application Data

(62) Division of application No. 09/613,331, filed on Jul. 7, 2000, now Pat. No. 7,098,538.

(30) Foreign Application Priority Data

Jul. 8, 1999 (JP) ............................... 11-193962

(51) Int. Cl.
*H01L 21/44* (2006.01)
(52) U.S. Cl. ................ 438/118; 438/624; 257/E23.127
(58) Field of Classification Search .................... 438/6, 438/108, 118, 618, 622, 625, 628, 637, 624
See application file for complete search history.

(56) References Cited

U.S. PATENT DOCUMENTS

| 4,791,609 A | 12/1988 | Ito |
| 5,124,273 A | 6/1992 | Minami |
| 5,162,240 A * | 11/1992 | Saitou et al. ................... 427/8 |
| 5,283,081 A * | 2/1994 | Kata et al. ...................... 430/5 |
| 5,300,798 A | 4/1994 | Yamazaki et al. |
| 5,430,397 A | 7/1995 | Itoh et al. |
| 6,278,148 B1 | 8/2001 | Watanabe et al. |

FOREIGN PATENT DOCUMENTS

| JP | 64-74751 | 3/1989 |
| JP | 7-22587 | 1/1995 |
| JP | 7-86502 | 3/1995 |
| JP | 7-307434 | 11/1995 |
| JP | A 7-231050 | 8/1996 |
| JP | 10-173057 | 6/1998 |
| JP | 10-209317 | 8/1998 |

* cited by examiner

*Primary Examiner*—Quoc Hoang
(74) *Attorney, Agent, or Firm*—Young & Thompson

(57) ABSTRACT

A system semiconductor device includes a system LSI cell portion and a global wiring layer. The system LSI cell portion has a plurality of functional blocks for realizing specific functions on a semiconductor chip. The global wiring layer has a wiring layer on a semiconductor substrate. The system LSI cell portion is laminated with the global wiring layer.

15 Claims, 14 Drawing Sheets

SYSTEM SEMICONDUCTOR DEVICE AND METHOD OF MANUFACTURING THE SAME

CROSS REFERENCE TO RELATED APPLICATIONS

This application is a division of application Ser. No. 09/613,331 filed on Jul. 7, 2000 U.S. Pat. No. 7,098,538, the entire contents of which are hereby incorporated by reference.

BACKGROUND OF THE INVENTION

This invention relates to a system semiconductor device and a method of manufacturing the same, and in particular, to a system semiconductor device having a plurality of functional blocks.

The conventional system LSI (Large-Scale-Integrated circuit) generally includes a plurality of functional blocks. Herein, it is to be noted that the functional block serves as a circuit unit for realizing a specific function. In such a system LSI, complex functions are integrated on one chip.

The conventional method of manufacturing the system LSI has been carried out as follows.

A plurality of functional blocks are first fabricated on a silicon chip. Thereafter, a circuit wiring layer which electrically connects the functional blocks to each other is formed on the silicon chip by the use of a metal vaporizing method or a metal plating method.

Subsequently, an insulating film is formed thereon and the circuit wiring layer and the insulating layer are sequentially laminated. Thereby, a global wiring layer serving as a multi-wiring layer is formed on the silicon chip.

Thus, a plurality of circuit wiring layers and insulating layers conventionally has been laminated for many times to manufacture the system LSI.

However, the conventional system LSI has the following problems.

First, manufacturing yield is degraded. This reason will be explained below. Namely, an external stress is applied or stress-migration occurs because a plurality of circuit wiring layers and insulating layers are laminated.

Under this circumstance, the circuit wiring layer is peeled from the insulating layer. Consequently, a physical strength is inevitably lowered.

Further, an electrical connection between layers is damaged. In consequence, electrical connection reliability is readily degraded.

Second, a manufacturing duration becomes long. This reason will be explained as follows.

Namely, after the system LSI is fabricated, a plurality circuit wiring layers and insulating layers are alternately laminated on a system LSI cell. To this end, complex and many steps are inevitably required.

Third, selection degree of freedom concerning materials of the global wiring layer and manufacturing processes is lowered. This reason will be described below.

That is, the manufacturing process of the global wiring layer or the materials of the circuit wiring layers and the insulating layers are restricted in dependency upon a laminating process. Consequently, the manufacturing process and the material can not freely or suitably selected.

Fourth, physical characteristics and electrical characteristics are degraded, and the manufacturing cost becomes high. This reason will be explained as follows.

The manufacturing process of the global wiring line layer or the materials of the circuit wiring layers and the insulating layers are restricted in accordance with the laminating process. Consequently, the manufacturing process and the material can not freely or suitably selected.

Fifth, the electrical characteristic for a high-frequency signal is degraded. This reason will be explained below.

That is, a system LSI cell portion and the global wiring line layer are adjacently arranged to each other. In consequence, dielectric constants are enhanced to each other, and impedance of the circuit is also increased.

SUMMARY OF THE INVENTION

It is therefore an object of this invention to provide a system semiconductor device which has a simple manufacturing step and a cheap manufacturing cost.

It is another object of this invention to provide a system semiconductor device which is capable of improving physical and electrical characteristics.

According to this invention, a system semiconductor device has a system LSI cell portion and a global wiring layer.

The system LSI cell portion includes a plurality of functional blocks for realizing specific functions. In this event, each of the functional blocks serves as a unit circuit and is arranged on a semiconductor chip.

A global wiring layer has a wiring layer on a semiconductor substrate.

With this structure, the system LSI cell portion is laminated or combined with the global wiring layer such that the functional blocks are electrically connected to each other.

In this case, a plurality of the system LSI cell portions are formed on a semiconductor wafer while a plurality of the global wiring layers are formed on the semiconductor substrate.

In this condition, the semiconductor wafer and the semiconductor substrate are laminated, diced and separated to obtain a plurality of the system semiconductor devices.

The global wiring layer includes a first wiring layer formed on the semiconductor substrate, an insulating layer formed on the first wiring layer, and a second wiring layer and an adhesive layer formed on the insulating layer.

Alternatively, the global wiring layer may include a first wiring layer formed on an organic substrate, an insulating layer formed on the first wiring layer, and a second wiring layer and an adhesive layer formed on the insulating layer.

Instead, the global wiring layer may have a first wiring layer formed on the semiconductor substrate, an insulating layer formed on the first wiring layer, a second wiring layer formed on the insulating layer, and inner bumps formed on the second wiring layer.

Alternatively, the global wiring layer may comprise a first wiring layer formed on an organic substrate, an insulating layer formed on the first wiring layer, a second wiring layer formed on the insulating layer, and inner bumps formed on the second wiring layer.

In this case, the insulating layer preferably includes a via which electrically connects the first wiring layer with the second wiring layer.

The global wiring layer may have bumps for electrically connecting to an external circuit on a surface thereof.

Further, the global wiring layer may include buried vias which electrically connect the functional blocks to an external circuit.

Moreover, the global wiring layer may have at least one or more of the wiring layers.

In addition, the global wiring layer may have at least one or more of the insulating layers.

DESCRIPTION OF PREFERRED EMBODIMENTS

First Embodiment

Figure 1A:
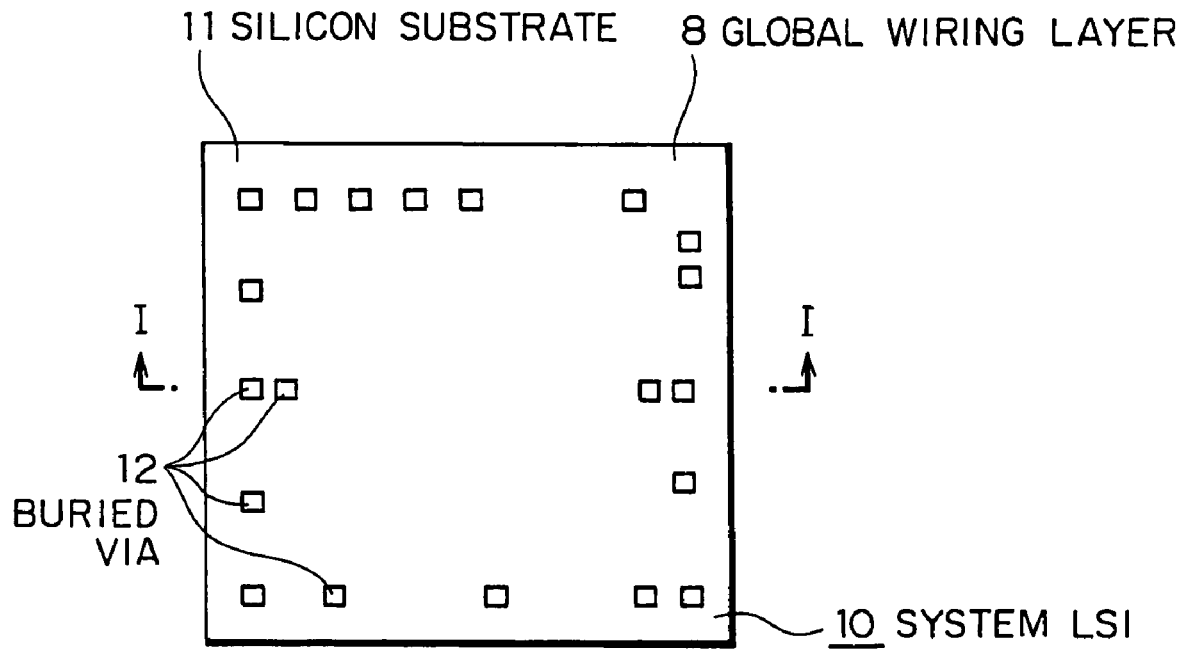
FIG. 1A is a plan view showing a system LSI according to a first embodiment of this invention.
Figure 1B:
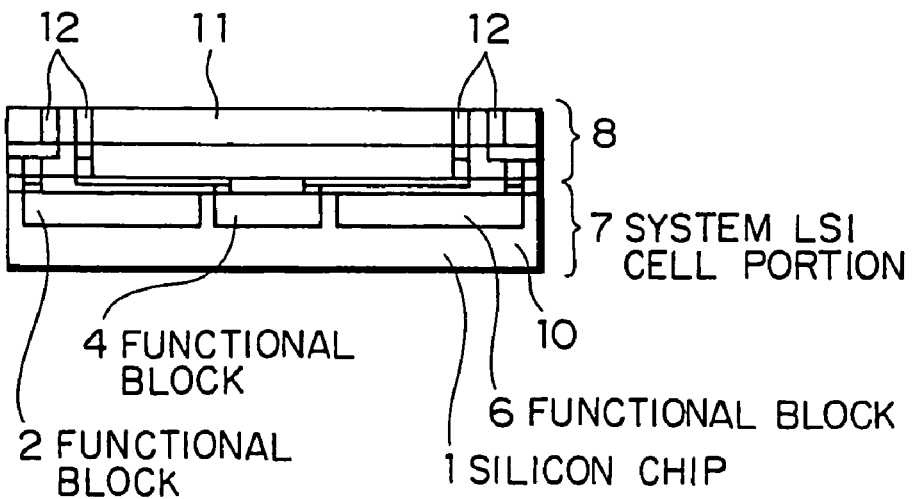
FIG. 1B is a cross sectional view, taken along I-I line in FIG. 1A.
Figure 2A:
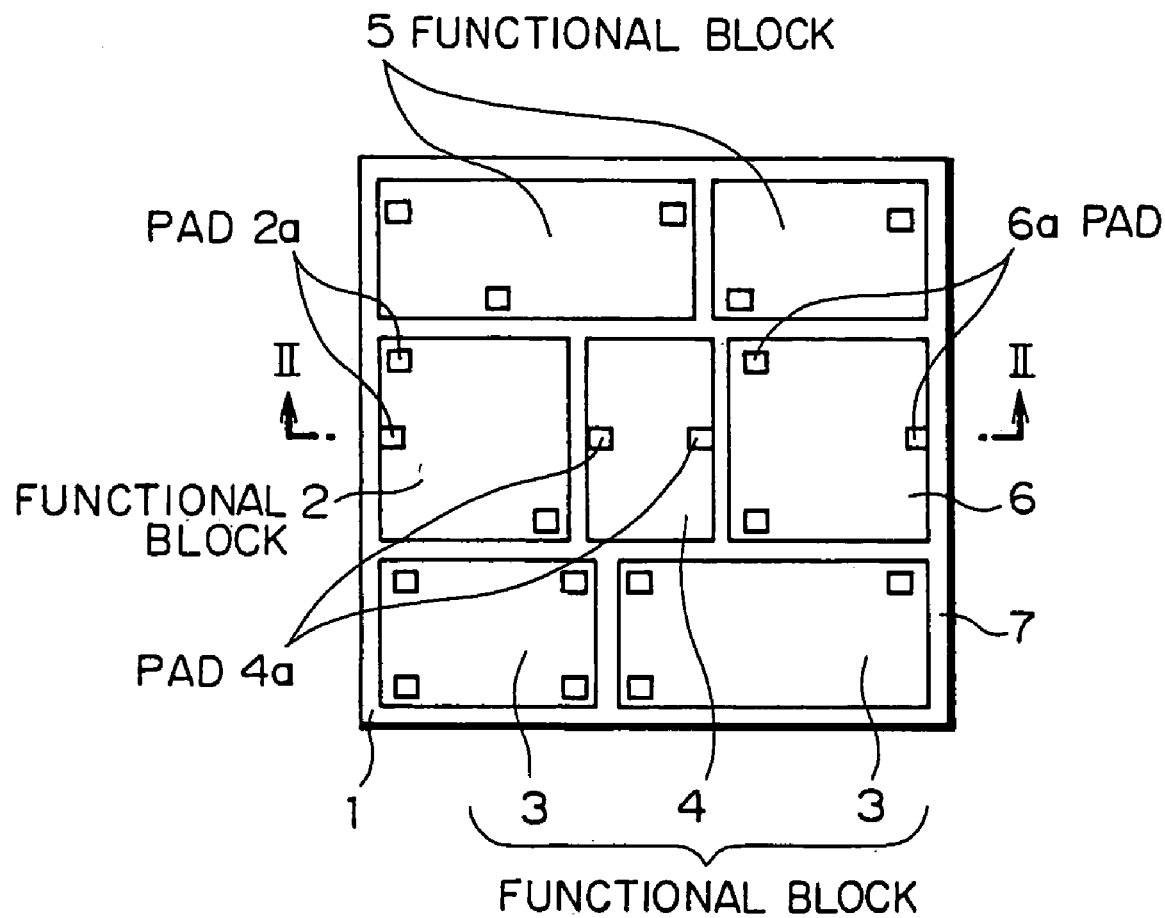
FIG. 2A is a plan view showing a system LSI cell portion according to a first embodiment of this invention.
Figure 2B:
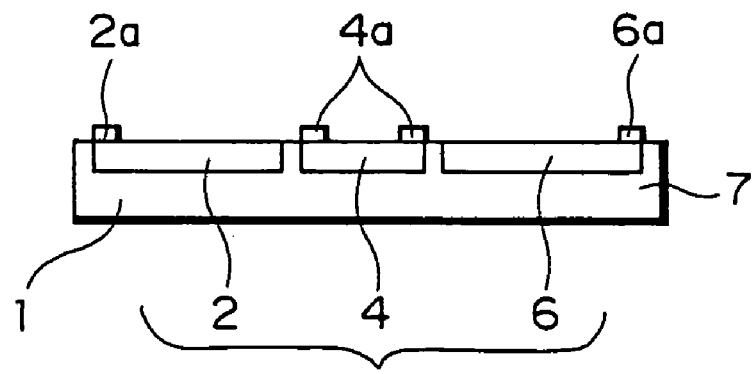
FIG. 2B is a cross sectional view, taken along II-II line in FIG. 2A.
Figure 3A:
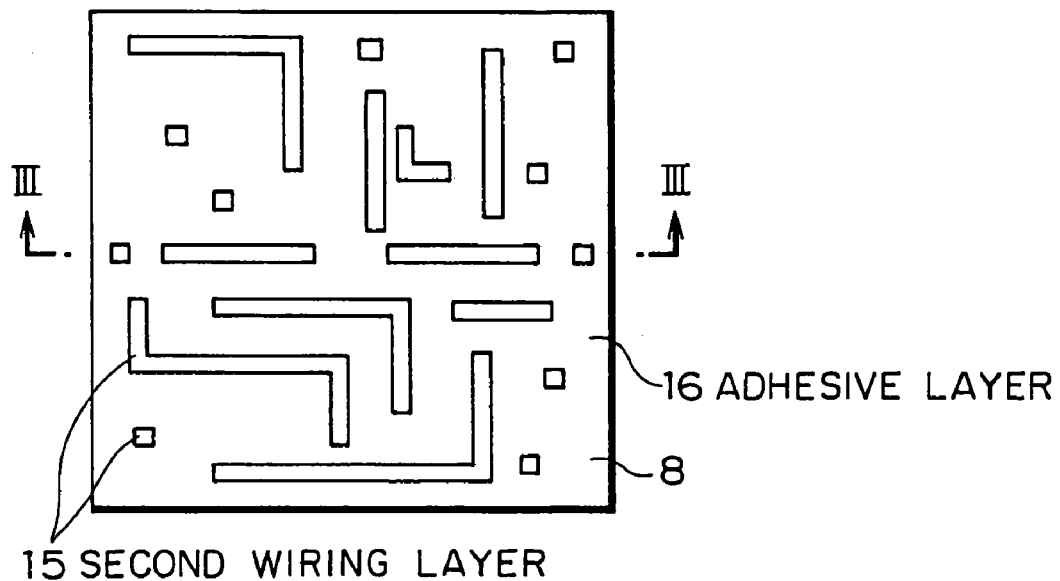
FIG. 3A is a plan view showing a global wiring layer according to a first embodiment of this invention.

Referring to FIG. 1 through FIG. 3, description will be made about a system LSI according to a first embodiment of this invention.

Figure 3B:
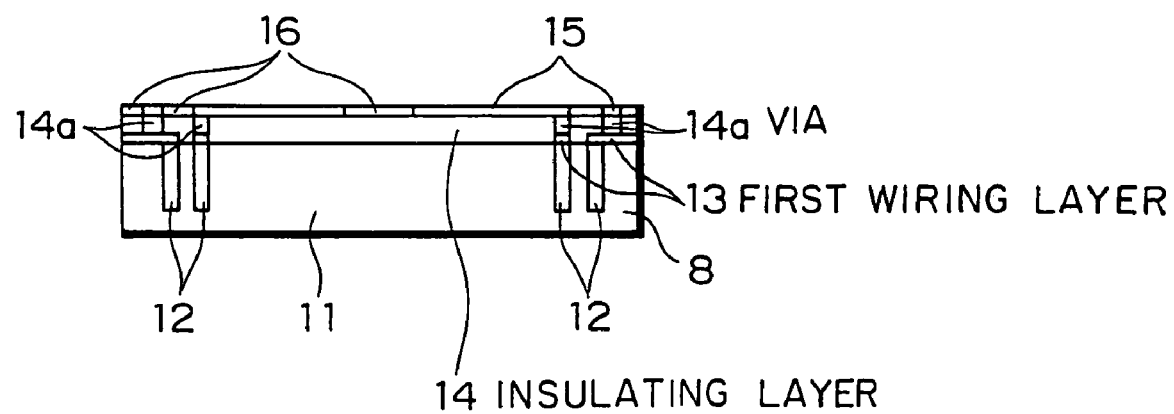
FIG. 3B is a cross sectional view, taken along III-III line in FIG. 3A.

A system LSI illustrated in FIG. 1 is formed by laminating or combining a system LSI cell portion 7 illustrated in FIG. 2A with a global wiring layer 8 illustrated in FIG. 3B on the condition that the global wiring layer is turned over.

In this case, the system LSI cell portion 7 has functional blocks 2 to 6, as illustrated in FIG. 2. While, the global wiring layer 8 mutually and electrically connects the functional blocks 2 to 6 formed on the system LSI cell portion 7, as illustrated in FIG. 3.

The system LSI cell portion 7 is composed of a silicon chip 1, and the functional blocks 2 to 6 formed on the surface of the silicon chip 1, as shown in FIGS. 2A and 2B.

In this case, the silicon chip 1 is formed by processing and separating a variety of semiconductor wafers such as a silicon wafer by a dicing process. Although the silicon chip 1 is realized by the silicon, the other arbitrary semiconductor materials may be used instead of the silicon.

Further, each of the functional blocks 2 to 6 serves as an unit circuit which realizes a specific function as a memory or a microcomputer, and is fabricated by performing a patterning process, an ion implanting process, and a stepper processing process for each part of the silicon chip 1, and has pads 2a to 6a serving as electrodes on the surface.

The global wiring layer 8 is composed of a silicon substrate 11, buried vias 12, a first wiring layer 13, an insulating layer 14, a second wiring layer 15, and an adhesive layer 16.

With such a structure, the global wiring line layer 8 mutually and electrically connects the functional blocks 2 to 6 on the system LSI cell portion 7, and is electrically coupled to an external circuit.

Herein, it is to be noted that the silicon substrate 11 is formed by processing and separating a variety of semiconductor wafers such as the silicon wafer by the use of the dicing process.

The buried via 12 is formed by performing a buried process for an internal of the silicon substrate 11 to penetrate the internal of the silicon substrate 11, and is formed by conductive material which electrically connects the functional blocks 2 to 6 with the external circuit.

In this event, the buried via 12 is formed by the use of a selection CVD (Chemical Vapor Deposition) method, a metal plating method or a conductive paste method.

The first wiring layer 13 is deposited by shaping conductive material of a variety of metals such as copper to a specific pattern on the surface of the silicon substrate 11, and electrically connects the buried via with a via 14a.

Herein, it is to be noted that the metal film serving as the first wiring layer 13 is formed by the use of the plating method or the sputtering method.

The insulating layer 14 is formed by depositing insulating material on the surface of the first wiring layer 13, and electrically insulates the first wiring layer 13 from the second wiring layer 15.

In this case, silicon compound of SiOx or SiNx, organic material, such as, polyimide and compound fluoride may be used as the insulating material of the insulating layer 14.

The via 14, which electrically connects the first wiring layer 13 with the second wiring layer 15, is formed at a specific position of the insulating film 14 by the use of the selective CVD method, the metal plating method or the conductive paste method. Herein, copper or copper alloy may be used as the material of the via 14.

The second wiring layer 15 is deposited by shaping conductive material of a variety of metals to a specific pattern on the surface of the insulating layer 14, and electrically connects the via 14a with electrodes 2 to 6 of the functional blocks 2 to 6.

Herein, it is to be noted that the metal film serving as the second wiring layer 15 is formed by the use of the plating method or the sputtering method.

The adhesive layer 16 is formed by a variety of adhesive materials, such as, heat-hardening resin or light-hardening resin, and is formed on the surface of the second insulating layer 15.

Although the first and second wiring layers 13 and 15 of the global wiring layer 8 are formed by Al, Al alloy, Cu, and Cu alloy, arbitrary conductive materials may be used other than them.

Similarly, although the insulating layer 14 is formed by a silicon oxide film, a silicon nitride film, and polyimide, optional material may be used other than them.

Likely, the buried via 12 and the via 14a are formed by burying the conductive metal for internal surface of the buried via 12 and the via 14a by the use of the selective CVD method or by plating the conductive metal, such as, Cu.

Alternatively, the buried via 12 and the via 14a may be formed by filling and hardening the conductive paste mixed with metal powder inside the buried via 12 and the via 14a. Instead, they may be formed by using an arbitrary method by the use of an optional conductive material.

Subsequently, description will be made about a method of manufacturing the system LSI according to the first embodiment.

Figure 4A:
FIGS. 4A through 4C are cross sectional views showing a method of manufacturing a system LSI cell portion of a system LSI according to a first embodiment of this invention.
Figure 4B:
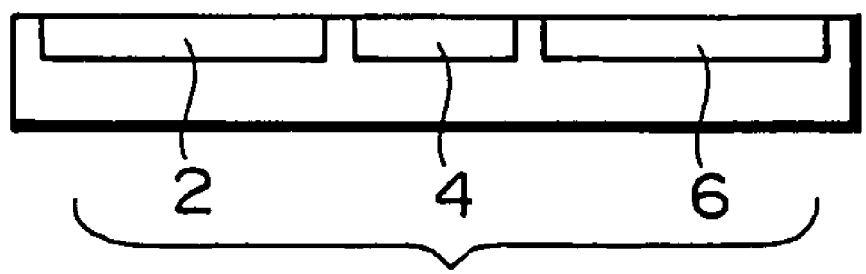
Figure 4C:
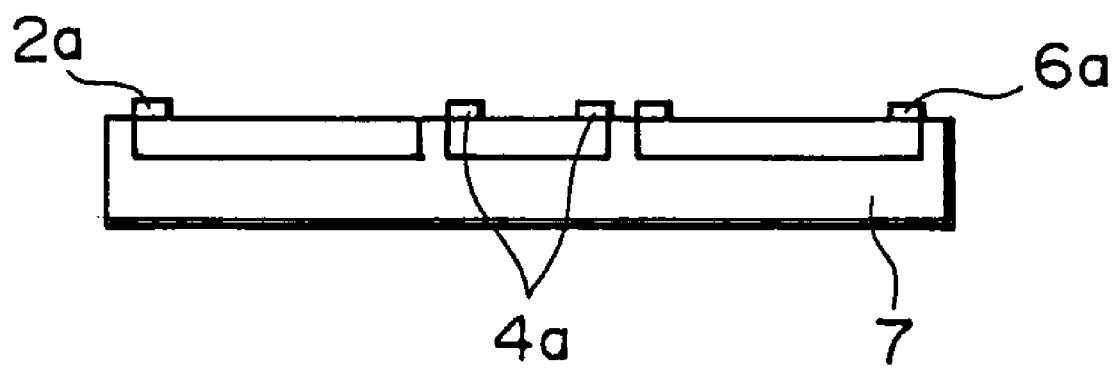

Referring to FIGS. 4A through 4C, description will be made about a method of manufacturing the system LSI cell portion 7 of the system LSI 10.

First, the silicon chip 1 is prepared by dicing and separating a silicon wafer, as illustrated in FIG. 4A.

Next, the pattern forming process, the ion injection process and the stepper process are carried out for the silicon chip 1 to form the functional blocks 2 to 6 on the silicon chip 1, as illustrated in FIG. 4B.

Herein, the respective gates in the functional blocks 2 to 6 are connected to each other by the use of polysilicon or a aluminum wiring pattern which is used in the general structure of the LSI wiring layer.

Subsequently, external terminals are formed to connect between the respective functional blocks 2 to 6. To this end, pads 2a to 6a are formed at specific portions on the surface of the functional blocks 2 to 6, as illustrated in FIG. 4C.

In this event, the connection net number between the functional blocks 2 to 6 of the pads 2a to 6a is largely low in comparison with the connection net number in the functional blocks 2 to 6. Consequently, the number of the pads 2a to 6a may be not much high.

Therefore, if each of the pads 2a to 6a has a size of 10 μm and a space (pitch) of 12 μm between the pads 2a to 6a, the pads 2a to 6a can be formed with such number that enough connection is possible.

Meanwhile, it is to be noted that each of the pads 2a to 6a may be formed by the use of metal film, such as, copper, gold, gold tin solder, tin lead solder. Thus, the system LSI cell portion 7 is completed.

Referring to FIGS. 5A through 5F, description will be made about the global wiring layer 8 of the system LSI 10.

Figure 5A:
FIGS. 5A through 5F are cross sectional views showing a method of manufacturing a global wiring layer of a system LSI according to a first embodiment of this invention.

First, the silicon substrate 11 is prepared, as illustrated in FIG. 5A.

Figure 5B:
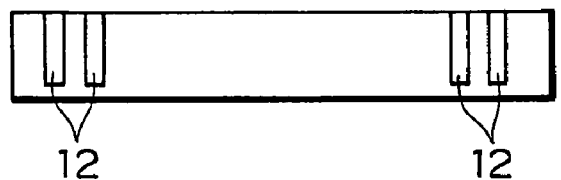

Next, the buried vias 12 are formed inside the silicon substrate 11 by the use of the selective CVD method or the metal plating method, as illustrated in FIG. 5B.

Figure 5C:
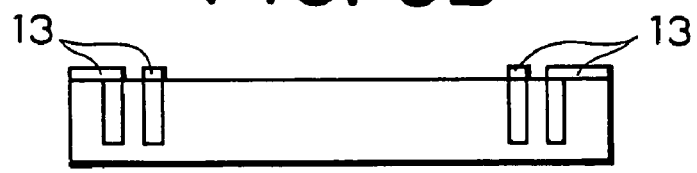

Successively, the conductive material, such as, Cu is deposited on the surface of the silicon substrate 11, and the first wiring layer 13 is formed by a patterning process after an exposing and developing process, as shown in FIG. 5C.

Figure 5D:
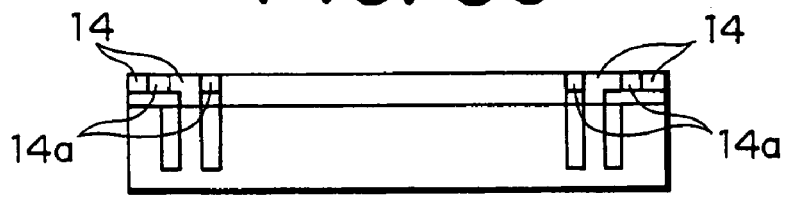

Subsequently, the insulating film 14 is deposited on the surface of the first wiring layer 13. Thereafter, the vias 14 are formed at specific portions in the insulating layer 14 so as to penetrate the insulating layer 14, as shown in FIG. 5D. Thereby, the via 14a electrically mutually connects the first wiring layer 13 with the second wiring layer 15.

Figure 5E:
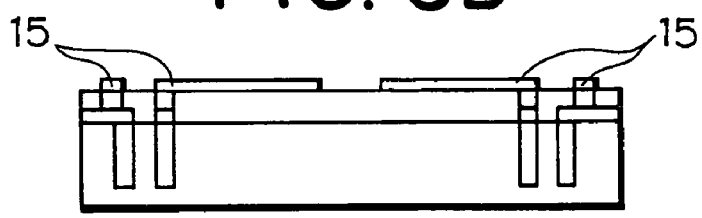

Next, the conductive material, such as, Cu and Au is deposited on the surface of the insulating layer 14 and the vias 14a by the sputtering method or the plating method, and the second wiring layer 15 is formed by the patterning process after the exposing and developing process, as illustrated in FIG. 5E.

Figure 5F:
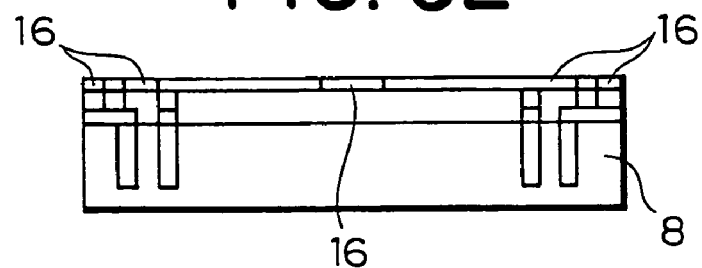

Finally, heat-hardening adhesives are supplied to a region except for a region where the second wiring layer 15 is formed on the surface of the global wiring layer 8 to form the adhesive layer 16, as illustrated in FIG. 5F. Thus, the global wiring layer 8 is completed.

In the first embodiment, the following process rule may be, for example, adopted.

Namely, a line width is equal 10 μm, and a wiring space is equal to 10 μm. Further, a conductor thickness of the first and second wiring layer 13 and 15 is equal to 10 μm while an insulating thickness of the insulating layer 14 is equal to 10 μm.

Thus, the global wiring layer 8 can be formed by the use of a relatively rough process rule in the first embodiment. Consequently, only the global wiring layer 8 can be independently manufactured by using cheaper equipment than a mounting equipment for forming the system LSI cell portion 7.

Although the first and second wiring layers 13 and 15 and the insulating layer 14 are used as the global wiring layer, the layer number of these wiring layers and the insulating layer is not restricted, and a single layer or a multiple layer may be used.

Figure 6A:
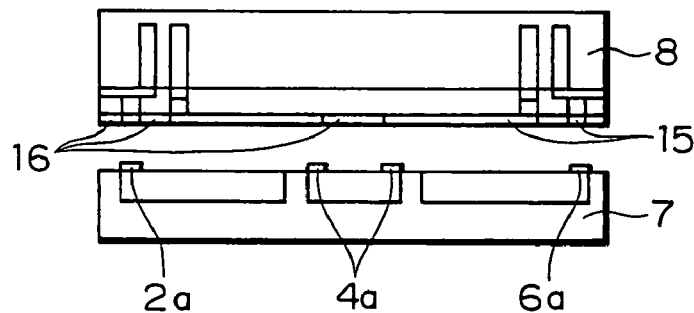
FIGS. 6A through 6C are cross sectional views showing a method of manufacturing a system LSI according to a first embodiment of this invention.
Figure 6B:
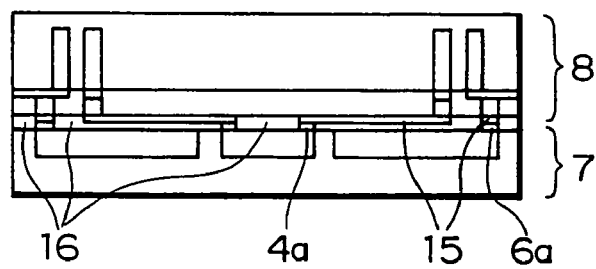
Figure 6C:
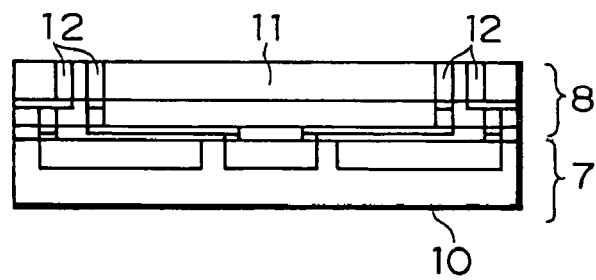

Referring to FIGS. 6A through 6C, description will be made about a method of manufacturing the system LSI 10.

The global wiring layer 8 is transferred onto the system LSI cell portion 7, as illustrated in FIG. 6A. In this event, the system LSI cell portion 7 is mounted on a stage (not shown) while the global wiring layer 8 is transferred on the condition that the global wiring layer 8 is turned over.

Under this circumstance, the pads 2a to 6a of the system LSI cell portion 7 are positioned in opposition to the second wiring layer 15 of the global wiring layer 8 by using a position detecting device, such as, an image camera.

Next, the LSI cell portion 7 and the global wiring layer are overlapped to each other. In the condition, a pressure is applied upwards and downward, and a heating process is carried out.

Thereby, the adhesive layer 16 is heat-hardened, and the system LSI cell portion 7 and the global wiring layer 8 are bonded and hardened. Consequently, the pads 2a to 6a of the system LSI cell portion 7 are coupled with the second wiring layer 15 of the global wiring layer 8, and are mutually and electrically connected, as illustrated in FIG. 6B.

Finally, the silicon substrate 11 is polished from an upper side of the global wiring layer 8, as illustrated in FIG. 6C. Thereby, the buried vias 12 are exposed on the surface, and serves as the electrodes for the external circuit. Thus, the system LSI 10 is completed.

Thus, after the system LSI cell portion 7 and the global wiring layer 8 are independently manufactured, and they are laminated or combined to form the system LSI 10, in the first embodiment.

After the system LSI cell portion 7 and the global wiring layer 8 are laminated or combined to each other, the buried vias 12 are exposed to the surface in the first embodiment.

Alternatively, after the buried vias 12 are exposed to the surface before the laminating or combining step, the system LSI may be manufactured by laminating or combining them.

Second Embodiment

Figure 7:
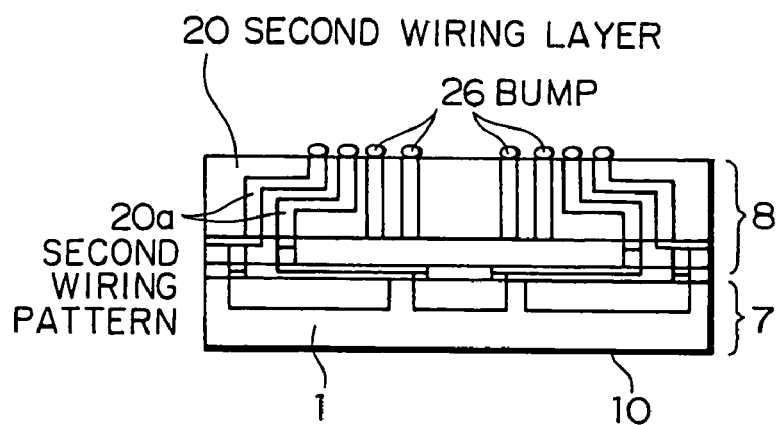
FIG. 7 is a plan view showing a system LSI according to a second embodiment of this invention.

Referring to FIG. 7, description will be made about a system LSI according to a second embodiment of this invention.

The system LSI 10 according to the second embodiment has a substantially similar structure with the system LSI according to the first embodiment.

However, the second embodiment is different from the first embodiment in that an organic substrate is used instead of the silicon substrate 11.

Herein, it is to be noted that organic material, such as, epoxy resin and polyimide, is used as a base member. As the organic substrate, a flexible substrate having a relatively thin thickness and flexibility is suitable.

Subsequently, description will be made about a method of manufacturing the system LSI 10 according to the second embodiment.

Referring to FIGS. 8A through 8E, description will be made about a method of manufacturing a global wiring layer 8 of the system LSI 10.

Figure 8A:
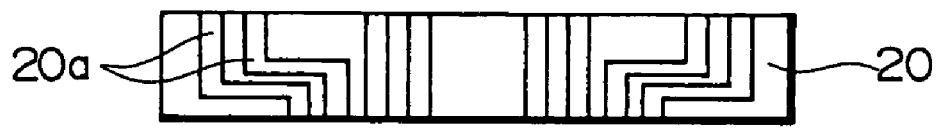
FIGS. 8A through 8E are cross sectional views showing a method of manufacturing a global wiring layer of a system LSI according to a second embodiment of this invention.
Figure 8B:
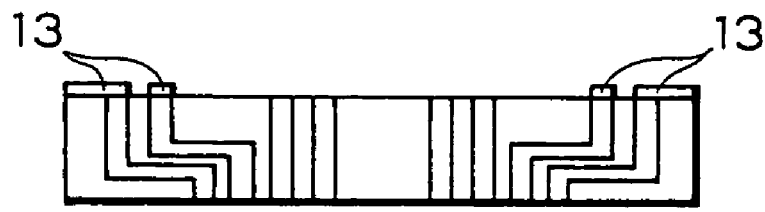
Figure 8C:
Figure 8D:
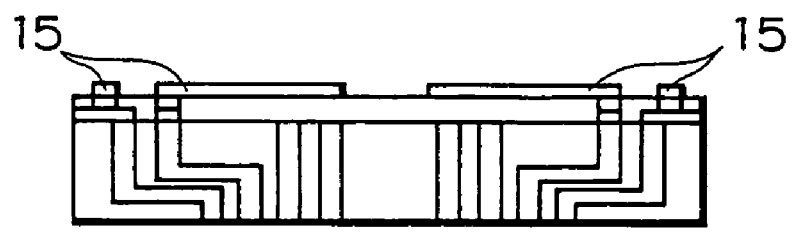
Figure 8E:
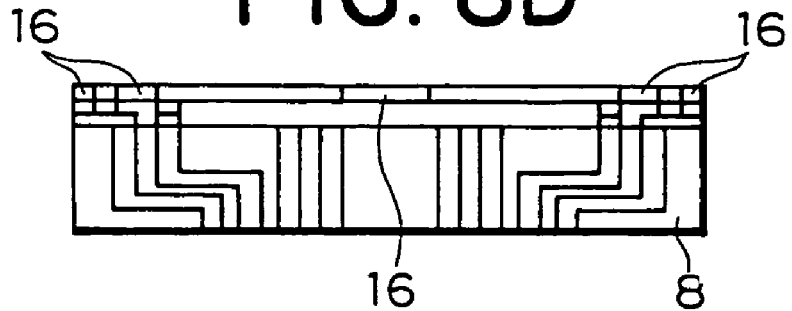

A plurality of second wiring layers 20a are laminated by the use of the known forming method of the multiple wiring pattern to form the second wiring layer 20, as shown in FIG. 8A.

Successively, the global wiring layer 8 is manufactured in the same manner as the steps illustrated in FIGS. 5A through 5E, as shown in FIGS. 8B through 8E.

Figure 9A:
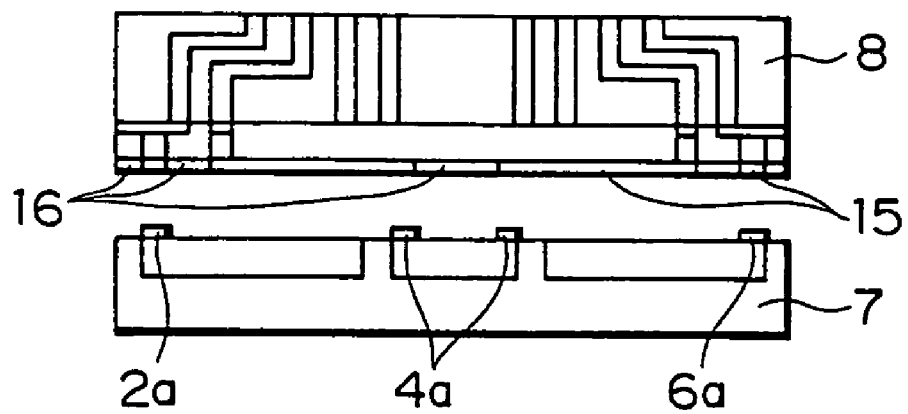
FIGS. 9A through 9C are cross sectional views showing a method of manufacturing a system LSI according to a second embodiment of this invention.
Figure 9B:
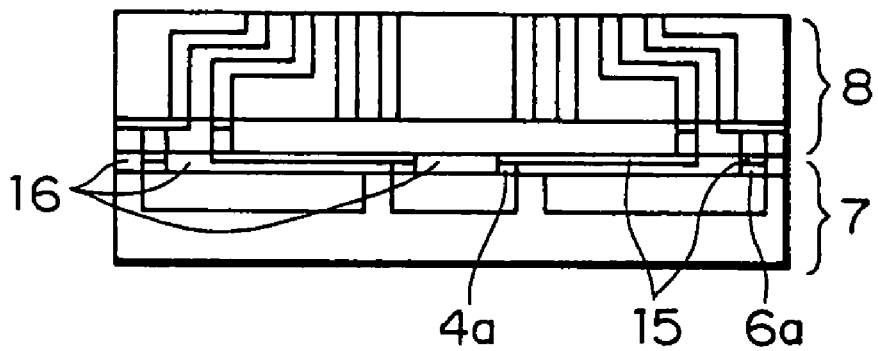
Figure 9C:
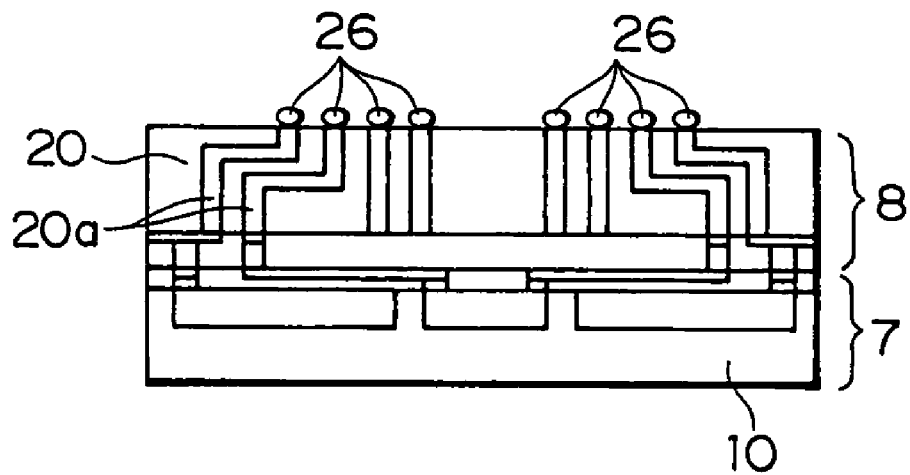

Referring to FIGS. 9A through 9C, description will be made about a method of manufacturing the system LSI 10 according to the second embodiment.

In the system LSI cell portion 7, the functional blocks 2 to 6 are formed on the surface of the silicon chip 1 in the same steps illustrated in FIG. 4A through FIG. 4C.

The global wiring layer 8 is transferred onto the system LSI cell portion 7 illustrated in FIG. 4C, as illustrated in FIG. 9A. In this event, the system LSI cell portion 7 is mounted on a stage (not shown) while the global wiring layer 8 is transferred on the condition that the global wiring layer 8 is turned over.

Under this circumstance, the pads 2a to 6a of the system LSI cell portion 7 are positioned in opposition to the wiring layer 15 of the global wiring layer 8 by using a position detecting device, such as, an image camera.

Next, the system LSI cell portion 7 and the global wiring layer are overlapped to each other. In the condition, a pressure is applied upwards and downward, and a heating process is carried out, as illustrated in FIG. 9B.

Thereby, the adhesive layer 16 is heat-hardened, and the system LSI cell portion 7 and the global wiring layer 8 are bonded and hardened. Consequently, the pads 2a to 6a of the system LSI cell portion 7 are coupled with the second wiring layer 15 of the global wiring layer 8, and are mutually and electrically connected.

Finally, solder balls are supplied on the surface of the second wiring layer 20a exposed at an upper side of the global wiring layer 8, and are welded to for bumps 26. Thereby, the system LSI 10 is completed.

Thus, as the material of the global wiring layer 8, the organic substrate formed by the organic material is used instead of the silicon substrate 11 as the semiconductor substrate 11 of the first embodiment in the second embodiment.

Thereby, the second wiring layer 20, which electrically connects the functional blocks 2 to 6 with the bumps 26, is integrally formed with the global wiring layer 8.

In consequence, the physical strength is enhanced, and the electrical connection reliability is also enhanced. Further, a technique, which has a low cost and is generally utilized for the organic wiring substrate, is applicable.

Third Embodiment

Figure 10:
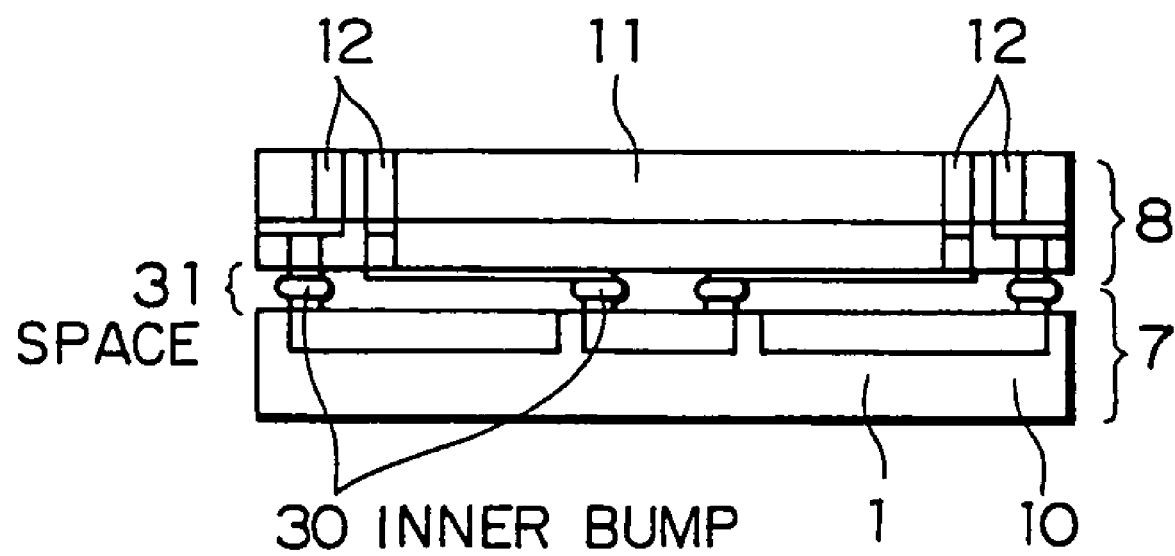
FIG. 10 is a plan view showing a system LSI according to a third embodiment of this invention.

Referring to FIG. 10, description will be made about a system LSI 10 according to a third embodiment of this invention.

The system LSI 10 according to the second embodiment has a substantially similar structure with the system LSI according to the first embodiment.

However, the third embodiment is different from the first embodiment in that the system LSI cell portion 7 is connected to the global wiring layer 8 with a space 31 through inner bumps 30.

Subsequently, description will be made about a method of manufacturing the system LSI 10 according to the third embodiment.

Referring to FIGS. 11A through 11F, description will be made about a method of manufacturing a global wiring layer 8 of the system LSI 10 according to the third embodiment.

The global wiring layer 8 is manufactured in the same steps illustrated in FIGS. 5A through 5E, as illustrated in FIGS. 11A through 11E.

Figure 11A:
FIGS. 11A through 11F are cross sectional views showing a method of manufacturing a global wiring layer of a system LSI according to a third embodiment of this invention.
Figure 11B:
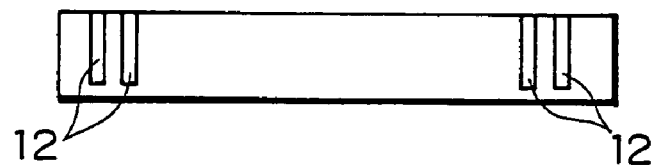
Figure 11C:
Figure 11D:
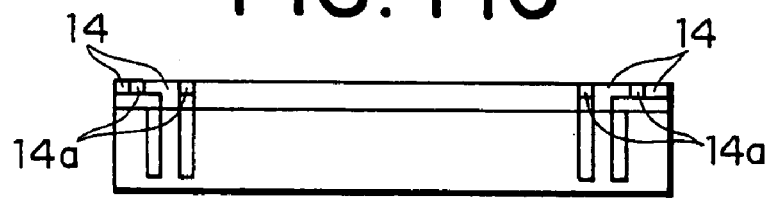
Figure 11E:
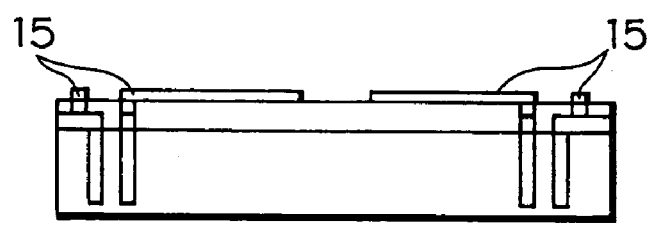
Figure 11F:
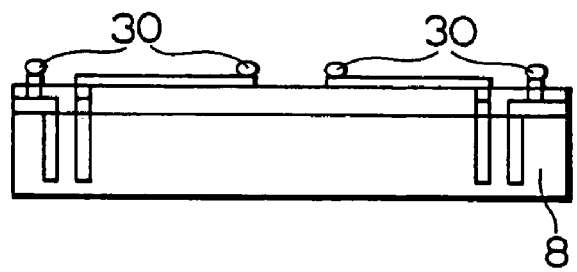

Successively, the solder balls are supplied to specific portions of the surface of the second wiring layer 15 to form the inner bumps on the global wiring layer 8, as illustrated in FIG. 11F.

Figure 12A:
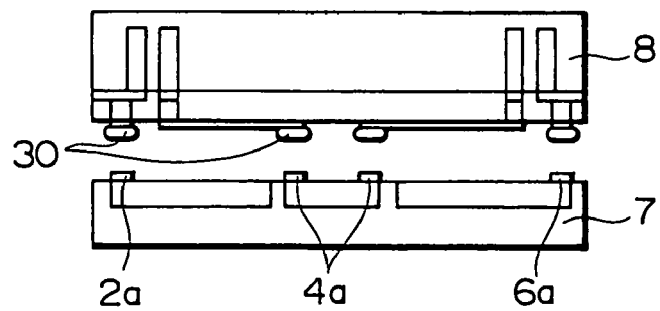
FIGS. 12A through 12C are cross sectional views showing a method of manufacturing a system LSI according to a third embodiment of this invention.
Figure 12B:
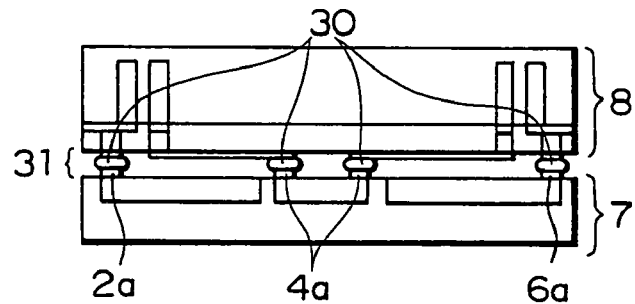
Figure 12C:
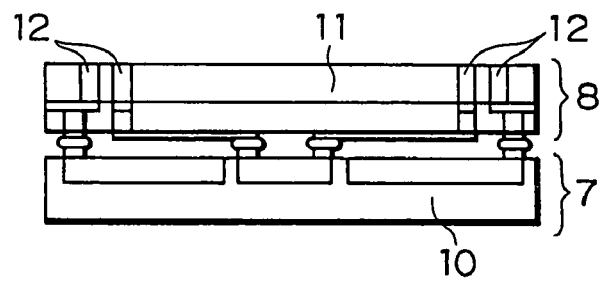

Referring to FIGS. 12A through 12C, description will be made about a method of manufacturing the system LSI 10 according to the third embodiment.

First, the system LSI cell portion 7 has been completed in the same steps illustrated in FIG. 4A through FIG. 4C.

The global wiring layer 8 is transferred onto the system LSI cell portion 7 illustrated in FIG. 4C, as illustrated in FIG. 12A. In this event, the system LSI cell portion 7 is mounted on a stage (not shown) while the global wiring layer 8 is transferred on the condition that the global wiring layer 8 is turned over.

Under this circumstance, the pads 2a to 6a of the system LSI cell portion 7 are positioned in opposition to the second wiring layer 15 of the global wiring layer 8 by using a position detecting device, such as, an image camera.

Next, a pressure is applied upwards and downward for the system LSI cell portion 7 and the global wiring layer 8, and a heating process is carried out for them to melt the inner bumps 30, as illustrated in FIG. 12B.

Thereafter, a cooling process is performed, and the system LSI cell portion 7 and the global wiring layer 8 are connected to each other via the inner bumps 30 with the space 31, as shown in FIG. 12B.

Finally, the silicon substrate 11 is polished from an upper side of the global wiring layer 8. Thereby, the buried vias 12 serving as the connection terminals with external circuit are exposed to the surface. Thus, the system LSI 10 is completed.

In the third embodiment, the system LSI cell portion 7 and the global wiring layer 8 are connected to each other via the inner bumps 30 such that the space 31 is formed therebetween.

Thereby, the global wiring layer 8 serving as dielectric is not adjacently and directly arranged for the system LSI cell portion 7.

Consequently, the system LSI cell portion 7 is readily and electrically separated from the global wiring layer 8, and the electrical characteristics for the high-frequency signal is improved. More specifically, transmission delay time becomes short.

When the physical characteristics is more important than the electrical characteristic, the space 31 may be sealed with filling material such as resin.

Fourth Embodiment

Figure 13:
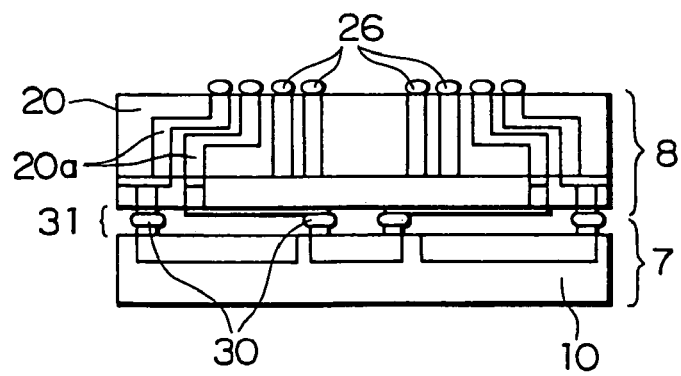
FIG. 13 is a plan view showing a system LSI according to a forth embodiment of this invention.

Referring to FIG. 13, description will be made about a system LSI 10 according to a fourth embodiment of this invention.

The system LSI 10 according to the forth embodiment combines the system LSI 10 of the second embodiment and the system LSI 10 of the third embodiment.

Subsequently, description will be made about a method of manufacturing the system LSI 10 according to the fourth embodiment.

The functional blocks 2 to 6 are formed on the surface of the silicon chip 1 in the same steps illustrated in FIG. 4A through FIG. 4C.

Referring to FIGS. 14A through 14E, description will be made about a method of manufacturing the global wiring layer 8.

The second wiring layer 20 having the second wiring pattern 20a is formed in the same manner as the steps illustrated in FIGS. 8A through 8D, as shown in FIGS. 14A through 14D.

Figure 14A:
FIGS. 14A through 14E are cross sectional views showing a method of manufacturing a global wiring layer of a system LSI according to a fourth embodiment of this invention.
Figure 14B:
Figure 14C:
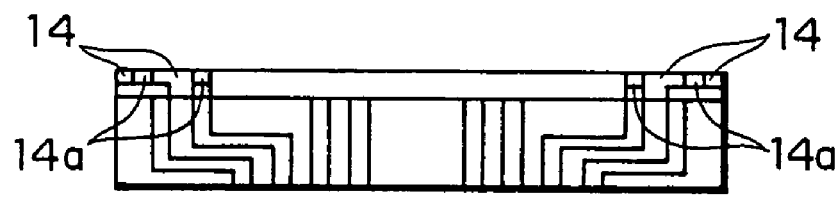
Figure 14D:
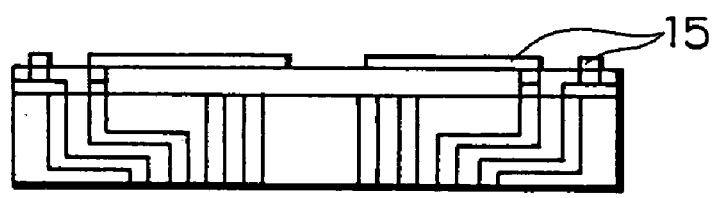
Figure 14E:
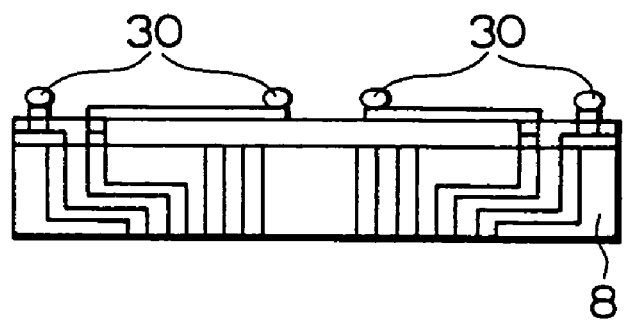

Subsequently, the inner bumps 30 for connecting the system LSI cell portion 7 are formed by supplying and melting the solder balls onto the second wiring layer 15, as illustrated in FIG. 14E. Thereby, the global wiring layer 8 is manufactured.

Figure 15A:
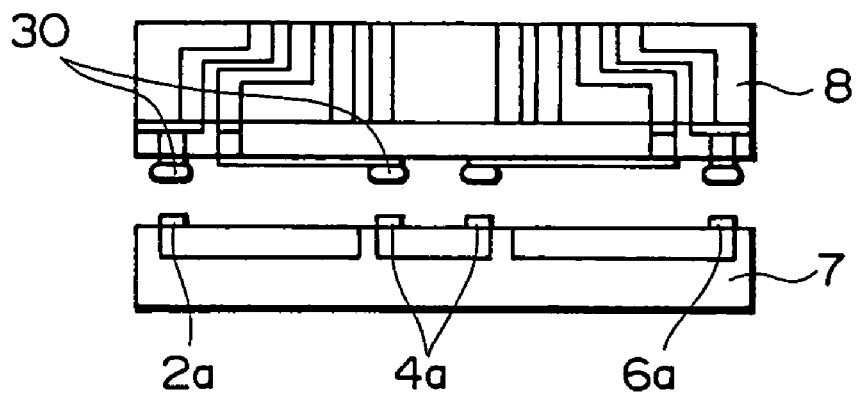
FIGS. 15A through 15C are cross sectional views showing a method of manufacturing a system LSI according to a fourth embodiment of this invention.
Figure 15B:
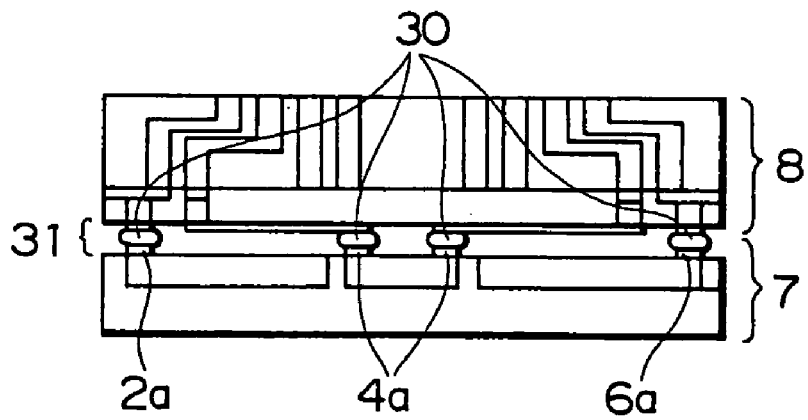
Figure 15C:
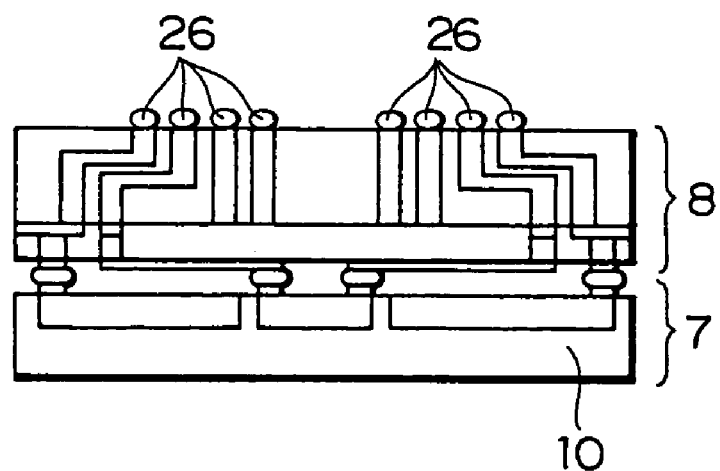

Referring to FIGS. 15A through 15C, description will be made about the system LSI 10 according to the fourth embodiment.

First, the system LSI cell portion 7 and the global wiring layer 8 are connected to each other in the same steps illustrated in FIGS. 12A and 12B, as shown in FIGS. 15A and 15B.

Finally, the bumps 26 are formed in the same steps illustrated in FIG. 9C, as shown in FIG. 15C. Thus, the system LSI 10 is completed.

Thus, as the material of the global wiring layer 8, the organic substrate formed by the organic material is used in lieu of the silicon substrate 11 as the semiconductor substrate of the first embodiment in the fourth embodiment.

Thereby, the second wiring layer 20, which electrically connects the functional blocks 2 to 6 with the bumps 26, is integrally formed with the global wiring layer 8.

In consequence, the physical strength is enhanced, and the electrical connection reliability is also enhanced. Further, a technique, which has a low cost and is generally utilized for the organic wiring substrate, is also applicable.

In addition, the system LSI cell portion 7 and the global wiring layer 8 are connected to each other via the inner bumps 30 such that the space 31 is formed therebetween.

Thereby, the global wiring layer 8 serving as dielectric is not adjacently and directly arranged for the system LSI cell portion 7.

Consequently, each impedance of the system LSI cell portion 7 and the global wiring layer 8 is lowered, and the electrical characteristic for the high-frequency signal is improved.

Fifth Embodiment

Referring to FIG. 16, description will be made about a method of manufacturing a system LSI 10 according to a fifth embodiment of this invention.

In the first through fourth embodiments, after the system LSI cell portion 7 is manufactured on the respective silicon chip 1 separated by dicing from the semiconductor wafer, the global wiring layer 8 manufactured from silicon substrate 11 having the same dimension as the silicon chip 1 is laminated.

Figure 16A:
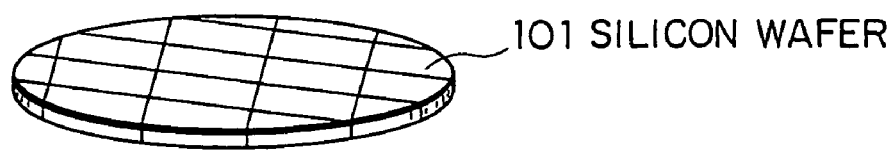
FIGS. 16A through 16E are cross sectional views showing a method of manufacturing a system LSI according to a fifth embodiment of this invention.

By contrast, a plurality system LSI cell portions 7 are manufactured on the silicon wafer 101 before dicing in the fifth embodiment, as illustrated in FIG. 16A. Thereafter, a plurality global wiring layers 8 are manufactured on the silicon substrate 111, as illustrated in FIG. 16B.

Figure 16B:
Figure 16C:
Figure 16C:
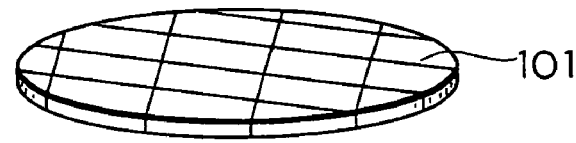

After the silicon wafer 101 and the silicon substrate 101 are laminated, the silicon wafer 101 and the silicon substrate 111 are integrated and diced to separate the respective system LSIs, as illustrated in FIG. 16C.

More specifically, the sputtering process, the development and exposing process, and the patterning process are first performed onto the silicon wafer 101, and a plurality of system LSI cell portions 7 are arranged in a plan direction on the silicon wafer 101, as illustrated in FIG. 16A.

Subsequently, the first wiring layer 13, the insulating layer 14, the second wiring layer 15, and the adhesive layer 16 or the inner bump 30 are formed on the silicon substrate 111 in the same steps as the first through fourth embodiments, and thereby, a plurality of global wiring layers 8 are arranged in a plan direction, as illustrated in FIG. 16B.

Successively, the silicon substrate 111 is transferred and positioned onto the silicon wafer 101 on the condition that the silicon substrate 111 is turned over, as illustrated in FIG. 16C. Thereby, the silicon wafer 101 is in opposition to the silicon substrate 111.

Figure 16D:
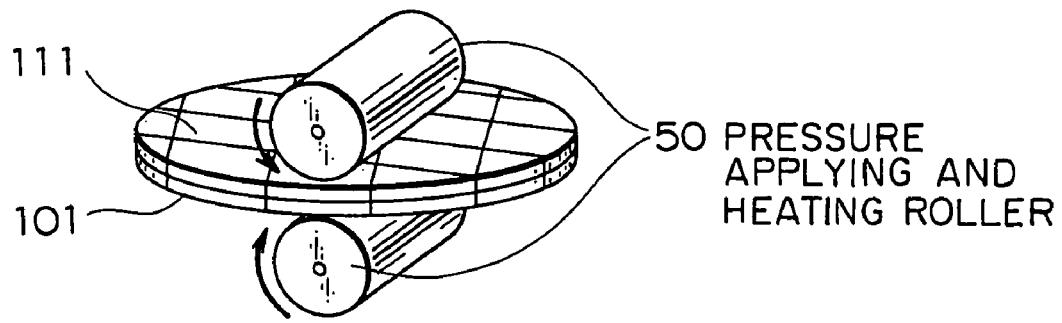

Next, a pressure is applied upwards and downwards for the silicon wafer 101 and the silicon substrate 111 by the use of a pair of pressure applying and heating rollers 50 to laminate them, as shown in FIG. 16D.

Figure 16E:
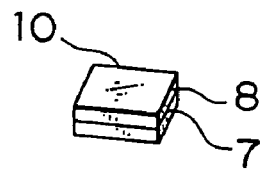

Finally, the laminated silicon wafer 101 and the silicon substrate 111 are diced to separate into the respective system LSIs 10, as shown in FIG. 16E.

Thus, in the fourth embodiment, a plurality of system LSI cell portions 7 formed on the silicon wafer 101 and a plurality of global wiring layers 8 formed on the silicon substrate 111 are laminated to each other. Thereafter, the laminated silicon substrate 111 and the silicon wafer 101 are separated into the respective system LSI 10.

In the first through fourth embodiments, the silicon chip 1 and the silicon substrate 11 are exemplified, and the silicon wafer 101 and the silicon substrate 111 are exemplified in the fifth embodiment. However, the material is not restricted to the silicon, and a variety of semiconductor materials, such as, GaAs (gallium arsenide) may be used.

Although the bump 26 is formed on the global wiring layer 8 only in the second and fourth embodiments, the bump 26 may be formed on the exposed surface of the buried via 12 in the other embodiments.

In the third and fourth embodiments, the pads 2a to 6a are formed on the system LSI cell portion 7 while the second wiring layer 8 is formed on the global wiring layer 8.

Conversely, the pads may be formed on the global wiring layer 8 while the pads or the bumps may be formed on the system LSI cell portion 7.

Although the adhesive layer 16 is supplied in the final step of the global wiring layer 8, the adhesive layer 16 may be supplied in an arbitrary step among a group of steps for laminating the system LSI cell portion 7 with the global wiring layer 8.

Further, the adhesive layer 16 or the inner bump 30 may be formed on the system LSI cell portion instead of the global wiring layer 8.

According to this invention, the manufacturing yield can be enhanced. This reason will be explained below.

Namely, after the system LSI cell portion having the functional blocks and the global wiring layer can be independently manufactured the system LSI can be readily fabricated only by laminating or combining them.

Further, the manufacturing duration can be shortened. The reason will be explained as follows.

That is, after the system LSI cell portion having the functional blocks and the global wiring layer can be independently manufactured the system LSI can be readily fabricated only by laminating them.

Moreover, the selective degree of freedom can be enhanced with respect to the manufacturing process and the material of the global wiring layer. This is because the global wiring layer can be independently manufactured and the mounting equipment becomes cheaper.

Further, the physical characteristics and the electrical characteristics are improved, and the manufacturing cost can be reduced. This is because a selective range of the manufacturing process and the material of the global wiring layer can be widened.

In addition, the electrical characteristics for the high-frequency signal can be improved. The reason will be described below.

Namely, the functional block is laminated with the global wiring layer by the use of the bump. Thereby, the space is formed between the functional block and the global wiring layer.

Consequently, the dielectric constant is reduced, and the high-frequency characteristic is improved. Further, an unnecessary electrical coupling is weakened.

What is claimed is:

1. A method of manufacturing a system semiconductor device, comprising the steps of:
    fabricating a system LSI cell portion by forming, on a semiconductor chip, a plurality of functional blocks which serve as unit circuits for realizing specific functions;
    fabricating a global wiring layer by forming conductor means in a substrate and forming a wiring layer of a single-layer or a multi-layer structure on the conductor means,
    forming an adhesive layer on one of an uppermost surface of the global wiring layer and a lowermost layer of the LSI cell portion, and
    laminating the system LSI cell portion with the global wiring layer with the adhesive layer located against the LSI cell portion and against the global wiring layer.

2. A method as claimed in claim 1, wherein the global wiring layer is obtained by the steps of
    forming a buried via as the conductor means in the semiconductor substrate, forming a first wiring layer on the buried via,
    forming an insulating layer on the first wiring layer,
    forming, on the insulating layer, a second wiring layer electrically connected to the first wiring layer through the via, and
    forming an inner bump on a surface of the second wiring layer.

3. A method as claimed in claim 1, wherein the global wiring layer is obtained by the steps of forming a secondary wiring layer as the conductor means in the substrate made of an organic material, forming a first wiring layer on the secondary wiring layer, forming an insulating layer on the first wiring layer, forming, on the insulating layer, a second wiring layer electrically connected to the first wiring layer through a via, and forming a pad on a surface of the second wiring layer.

4. A method as claimed in claim 1, wherein the global wiring layer is obtained by further forming a bump which is arranged on a substrate surface on the side where the wiring layer is not formed and which is adapted to be electrically connected to an external circuit through the conductor means.

5. A method as claimed in claim 1, wherein the global wiring layer has one or more wiring layers as the wiring layer.

6. A method as claimed in claim 1, wherein the global wiring layer has one or more insulating layers as the insulating layer.

7. A method as claimed in claim 1, comprising the steps of forming a plurality of the system LSI cell portions on a semiconductor wafer, forming a plurality of the global wiring layers on the semiconductor substrate, laminating the semiconductor wafer and the semiconductor substrate, and dicing and separating the laminated semiconductor wafer and the semiconductor substrate to obtain a plurality of the system semiconductor devices.

8. A method as claimed in claim 1, wherein the adhesive layer is formed on the uppermost surface of the global wiring layer.

9. A method as claimed in claim 1, wherein the adhesive layer is formed on the lowermost layer of the LSI cell portion.

10. A method of manufacturing a system semiconductor device, comprising the steps of:
    fabricating a system LSI cell portion by forming, on a semiconductor chip, a plurality of functional blocks which serve as unit circuits for realizing specific functions;
    fabricating a global wiring layer by forming conductor means in a substrate and forming a wiring layer of a single-layer or a multi-layer structure on the conductor means, and
    laminating the system LSI cell portion with the global wiring layer, wherein the global wiring layer is obtained by the steps of:
    forming a buried via as the conductor means in the semiconductor substrate,
    forming a first wiring layer on the buried via,
    forming an insulating layer on the first wiring layer,
    forming, on the insulating layer, a second wiring layer electrically connected to the first wiring layer through a via, and forming an adhesive layer on the insulating layer in an area where the second wiring layer is not formed.

11. A method as claimed in claim 10, wherein the global wiring layer has one or more wiring layers as the wiring layer.

12. A method as claimed in claim 10, wherein the global wiring layer has one or more insulating layers as the insulating layer.

13. A method of manufacturing a system semiconductor device, comprising the steps of:
fabricating a system LSI cell portion by forming, on a semiconductor chip, a plurality of functional blocks which serve as unit circuits for realizing specific functions;
fabricating a global wiring layer by forming conductor means in a substrate and forming a wiring layer of a single layer or a multi-layer structure on the conductor means, and
laminating the system LSI cell portion with the global wiring layer,
wherein the global wiring layer is obtained by the steps of
forming a secondary wiring layer as the conductor means in the substrate made of an organic material,
forming a first wiring layer on the secondary wiring layer,
forming an insulating layer on the first wiring layer,
forming, on the insulating layer, a second wiring layer electrically connected to the first wiring layer through a via, and
forming an adhesive layer on the insulating layer in an area where the second wiring layer is not formed.

14. A method as claimed in claim 13, wherein the global wiring layer has one or more wiring layers as the wiring layer.

15. A method as claimed in claim 13, wherein the global wiring layer has one or more insulating layers as the insulating layer.

* * * * *